United States Patent
Siemieniec et al.

(10) Patent No.: US 9,356,017 B1
(45) Date of Patent: May 31, 2016

(54) SWITCH CIRCUIT AND SEMICONDUCTOR DEVICE

(71) Applicant: Infineon Technologies Austria AG, Villach (AT)

(72) Inventors: Ralf Siemieniec, Villach (AT); Gilberto Curatola, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/614,578

(22) Filed: Feb. 5, 2015

(51) Int. Cl.
| H01L 29/66 | (2006.01) |
| H01L 27/06 | (2006.01) |
| H01L 29/20 | (2006.01) |
| H01L 29/778 | (2006.01) |
| H01L 29/872 | (2006.01) |
| H01L 29/16 | (2006.01) |

(52) U.S. Cl.
CPC ............. *H01L 27/0629* (2013.01); *H01L 29/16* (2013.01); *H01L 29/2003* (2013.01); *H01L 29/778* (2013.01); *H01L 29/872* (2013.01)

(58) Field of Classification Search
CPC ............ H01L 27/0629; H01L 27/0255; H01L 29/2003; H01L 29/778; H01L 29/872
USPC .......................................................... 257/194
See application file for complete search history.

(56) References Cited

U.S. PATENT DOCUMENTS

| 7,288,803 | B2 | 10/2007 | Beach et al. |
| 7,470,958 | B2 | 12/2008 | Hirose et al. |
| 7,838,907 | B2 | 11/2010 | Shiraishi |
| 7,859,051 | B2 | 12/2010 | Siemieniec et al. |
| 9,076,853 | B2 * | 7/2015 | Briere ................. H01L 27/0605 |
| 2010/0264462 | A1 | 10/2010 | Hirler et al. |
| 2011/0210337 | A1 | 9/2011 | Briere |
| 2011/0210338 | A1 | 9/2011 | Briere |
| 2013/0015498 | A1 | 1/2013 | Briere |

* cited by examiner

*Primary Examiner* — Tu-Tu Ho
(74) *Attorney, Agent, or Firm* — Murphy, Bilak & Homiller, PLLC

(57) ABSTRACT

In an embodiment, a switch circuit includes an input drain node, an input source node and an input gate node, and a high voltage transistor having a current path coupled in parallel with a hybrid diode. The hybrid diode includes a depletion mode transistor serially coupled with a diode and operatively coupled in a cascode arrangement with the input source node.

20 Claims, 5 Drawing Sheets

SWITCH CIRCUIT AND SEMICONDUCTOR DEVICE

BACKGROUND

To date, transistors used in power electronic applications have typically been fabricated with silicon (Si) semiconductor materials. Common transistor devices for power applications include Si CoolMOS, Si Power MOSFETs, and Si Insulated Gate Bipolar Transistors (IGBTs). More recently, silicon carbide (SiC) power devices have been considered. Group III-N semiconductor devices, such as gallium nitride (GaN) devices, are now emerging as attractive candidates to carry large currents, support high voltages and to provide very low on-resistance and fast switching times.

SUMMARY

In an embodiment, a switch circuit includes an input drain node, an input source node, an input gate node and a high voltage transistor having a current path coupled in parallel with a hybrid diode. The hybrid diode includes a depletion mode transistor serially coupled with a diode and operatively coupled in a cascode arrangement with the input source node.

In an embodiment, a semiconductor device includes an input drain node, an input source node, an input gate node, a high voltage Group III nitride-based transistor having a current path coupled in parallel with a hybrid diode and a silicon-based substrate. The hybrid diode includes a depletion mode Group III nitride-based transistor serially coupled with a diode and operatively coupled in a cascode arrangement with the input source node. The high voltage Group III nitride-based transistor includes a plurality of transistor cells connected in parallel with each other. The Group III nitride-based depletion mode transistor includes one of said transistor cells or a predetermined number of said transistor cells coupled in parallel. The diode is arranged at least in part in the silicon-based substrate.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
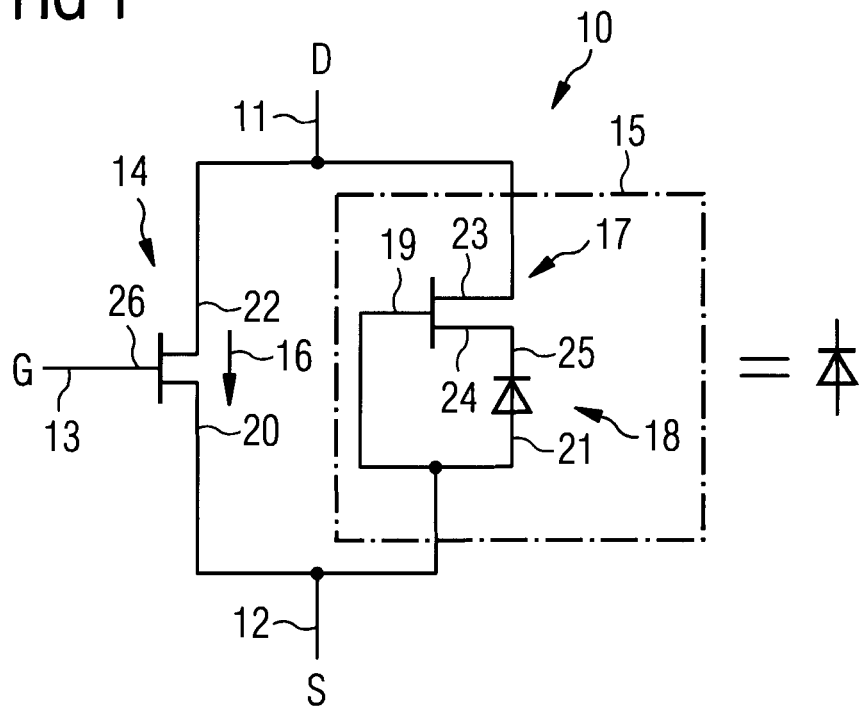
FIG. 1 illustrates a schematic diagram of a switch circuit according to a first embodiment.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, the terms "coupled" and/or "electrically coupled" are not meant to mean that the elements must be directly coupled together-intervening elements may be provided between the "coupled" or "electrically coupled" elements.

In the case of n-channel devices, a depletion-mode device, such as a high-voltage depletion-mode transistor, has a negative threshold voltage which means that it can conduct current at zero gate voltage. These devices are normally on. For n-channel devices, an enhancement-mode device, such as a low-voltage enhancement-mode transistor, has a positive threshold voltage which means that it cannot conduct current at zero gate voltage and is normally off.

As used herein, the phrase "Group III-Nitride" refers to a compound semiconductor that includes nitrogen (N) and at least one Group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aP_bN_{(1-a-b)}$), for example. Aluminum gallium nitride refers to an alloy described by the formula $Al_xGa_{(1-x)}N$, where x<1.

FIG. 1 illustrates a schematic diagram of circuit, in particular a switching circuit 10, according to a first embodiment. The switching circuit 10 includes an input drain node 11, an input source node 12, an input gate node 13, a high-voltage transistor 14 and a hybrid diode 15. The high-voltage transistor 14 includes a current path 16 which is coupled in parallel with the hybrid diode 15. The hybrid diode 15 includes a depletion mode transistor 17 which is serially coupled with a diode 18. The depletion mode transistor 17 is also operatively coupled in a cascode arrangement with the input source node 12.

A gate 19 of the depletion mode transistor 17 is coupled with a source 20 of the high-voltage transistor and an anode 21 of the diode 18 in order to operatively couple the depletion mode transistor 17 with the input source node 12 in a cascode arrangement. A source 24 of the depletion mode transistor 17 is coupled with the cathode 25 of the diode 18 such that the depletion mode transistor 17 is serially coupled with the diode 18.

The input source node 12 is coupled to the anode 21 of the diode 18 and the source 20 of the high-voltage transistor 14. The drain 22 of the high-voltage transistor 14 is coupled to the drain 23 of the depletion mode transistor 17 and the input drain node 11 in order that the hybrid diode 15 is coupled in parallel with the high-voltage transistor 14. A gate 26 of the high-voltage transistor 14 is coupled to the input gate mode 13.

Figure 2:
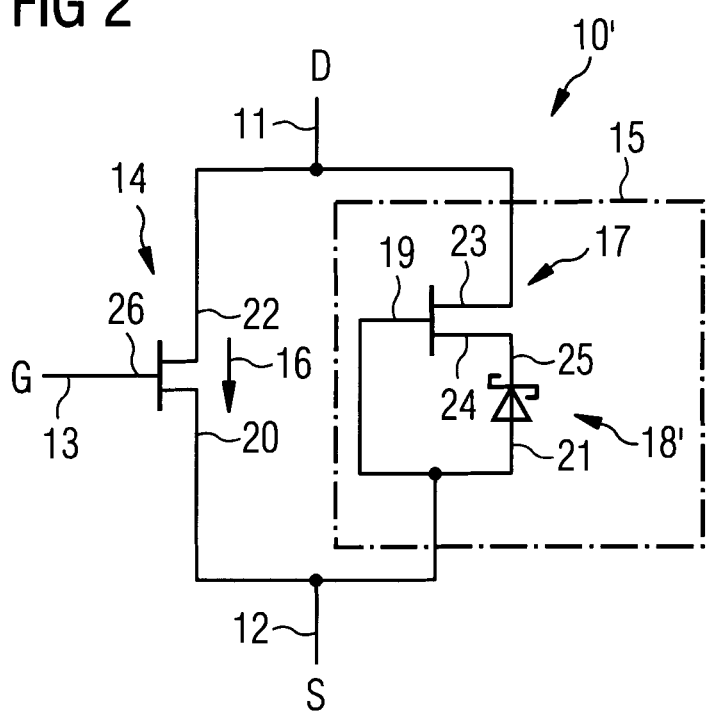
FIG. 2 illustrates a schematic diagram of a switch circuit according to a second embodiment.

FIG. 2 illustrates a schematic diagram of a switching circuit 10' according to a second embodiment. The switching circuit 10' according to the second embodiment differs from the circuit 10 of first embodiment illustrated in FIG. 1 simply in the type of diode 18' of the hybrid diode 15. According to the second embodiment, the diode 18' is a Schottky diode.

The high-voltage transistor 14 may include a Group III-Nitride transistor and the circuit 10 may be used as switching element, for example, of a power conversion device. A power conversion device is a device which converts input power to a desired output power by controlling ON/OFF of an element called a switching element, and is utilized in various purposes such as a power supply of an electronic devices and driving power supply for a motor or the like.

The hybrid diode 15 may be used to provide an inherent diode function having a low forward voltage drop in a high-voltage transistor 14, such as a Group III-nitride based HEMT.

The depletion mode transistor 17 may be formed using a part of the high-voltage transistor 14 for a diode and connected with a low-voltage diode, for example a silicon-based pn diode, to form a hybrid diode 15. This hybrid diode 15 provides a diode function with a forward voltage drop being equal to the knee voltage of the diode plus the forward voltage drop through the high-voltage transistor channel depending on the current through the device. Since the blocking voltage of the diode must only be enough to withstand the pinch-off voltage of the high-voltage transistor device, it is possible to use a Schottky diode in place of a pn diode.

In principle, the reverse current (leakage) level of such a circuit is rather constant until breakdown of the device is reached. The level of this leakage current is determined by the leakage current of the diode at the pinch-off voltage.

The high-voltage transistor 14 may be a depletion mode transistor or enhancement mode transistor and be either normally on or normally off, respectively. The depletion mode transistor 17 may be at least partially integrated in the high-voltage transistor 14. The high-voltage transistor 14 may include a plurality of transistor cells coupled in parallel with one another and integrated in a semiconductor substrate. The depletion mode transistor 17 may include one of these transistor cells or a predetermined number of these transistor cells coupled in parallel.

The switching circuit 10, 10' may be provided by various arrangements. For example, in one embodiment, the high-voltage transistor 14, the depletion mode transistor 17 and the diode 18 are monolithically integrated. This embodiment may be used in embodiments in which the depletion mode transistor 17 is at least partially integrated in the high-voltage transistor 14.

In some embodiments, the high-voltage transistor 14, the depletion mode transistor 17 and the diode 18 are each provided as a discrete component. In some embodiments, the high-voltage transistor 14, the depletion mode transistor 17 and the diode 18 are arranged in a composite package.

The high-voltage transistor 14 may include a Group III nitride-based transistor, such as a Group III nitride based Bipolar transistor or a Group III nitride-based High Electron Mobility Transistor (HEMT) such as a gallium nitride-based HEMT.

The diode 18 may be a silicon-based diode, such as a silicon-based pn diode or a silicon based Schottky diode.

In an embodiment, the circuit switching circuit 10 is provided by a semiconductor device including an input drain node, an input source node, an input gate node, a high-voltage Group III nitride-based transistor, a hybrid diode and a silicon-based substrate. The high-voltage Group III nitride-based transistor includes a current path coupled in parallel with the hybrid diode. The hybrid diode includes a depletion mode Group III nitride-based transistor which is serially coupled with a diode and operatively coupled in a cascode arrangement with the input source node. The high-voltage Group III nitride-based transistor includes a plurality of transistor cells parallel in series with each other. The depletion mode transistor includes one of the transistor cells or a predetermined number of the transistor cells of the high-voltage Group III nitride-based transistor coupled in parallel. The diode of the hybrid diode is arranged at least in part in the silicon-based substrate.

The semiconductor device may be considered to being include a monolithically integrated high-voltage transistor and a hybrid diode which includes a silicon-based low voltage diode integrated in the substrate and a portion of the high-voltage Group III nitride based transistor coupled in a cascode arrangement with the input source node, the source of the high-voltage Group III nitride based transistor and the anode of the diode.

The high-voltage Group III nitride-based transistor may be arranged on the silicon substrate and may be epitaxially grown on the silicon-based substrate. The silicon-based substrate may include silicon or silicon carbide and may be n-doped or p-doped. The source of the depletion mode Group III nitride-based transistor which forms part of the hybrid diode is coupled with a cathode of the diode, for example by a conductive via. The cathode of the diode may be provided by a highly doped region of the silicon-based substrate which is arranged underneath the Group III nitride-based layers which are used to form the high-voltage Group III nitride-based transistor.

The conductive via may further include electrically insulated cladding. The cladding electrically insulates the conductive material of the conductive via from at least some of the layers forming the high-voltage Group III nitride based transistor and the depletion mode Group III nitride-based transistor. The gate of the depletion mode transistor may be coupled with a source of the high-voltage Group III nitride-based transistor and an anode of the diode which is arranged at least in part on the silicon-based substrate.

In some embodiments, the gate of the depletion mode Group III nitride based transistor is coupled to the source by a conductive via. For example the conductive via may be arranged in a non-active region of the semiconductor device and may extend between the gate pad and the substrate, whereby the substrate is coupled with the source of the high-voltage Group III nitride transistor.

Figure 3A:
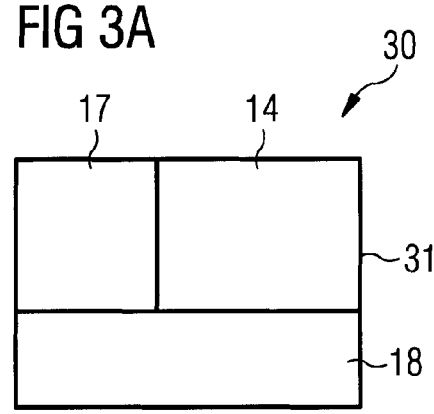
FIG. 3*a* illustrates a schematic view of an arrangement for providing the switch circuit illustrated in FIGS. 1 and 2.

The switch circuit 10, 10' may be provided by devices having various physical forms and arrangements. FIG. 3a illustrates a schematic view of a first arrangement 30 for providing the switch circuit 10, 10' illustrated in FIGS. 1 and 2.

In the first arrangement 30, the high voltage transistor 14, the depletion mode transistor 17 and the diode 18 are monolithically integrated in a single semiconductor body 31 comprising two differing semiconductor materials. In some embodiments, the diode 18 is a silicon-based pn diode or a Schottky diode and the high voltage transistor 14 and the depletion mode transistor 17 are formed from a compound semiconductor. For example, the high voltage transistor 14 and the depletion mode transistor 17 may be Group III nitride-based transistors, such as a gallium nitride-based HEMT. The depletion mode transistor 17 may be formed by a transistor cell of the high-voltage transistor 14 or a plurality of cells of the high voltage transistor 14 coupled in parallel. The single semiconductor body 31 includes a structure having an equivalent circuit t that illustrated in FIGS. 1 and 2.

Figure 3B:
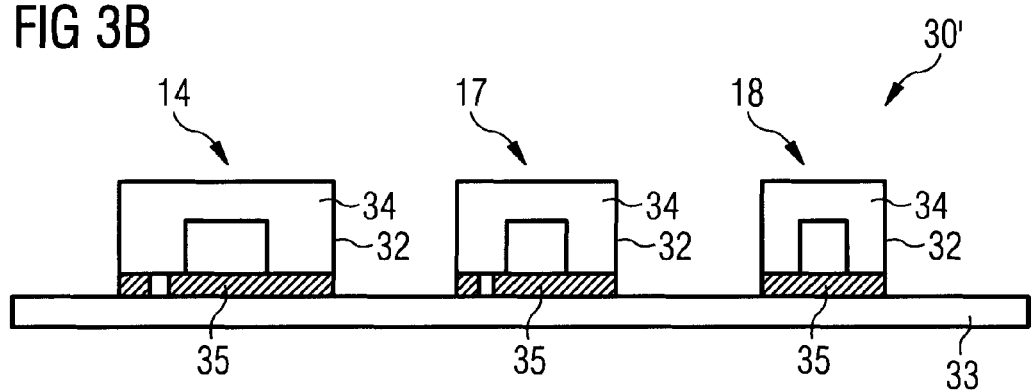
FIG. 3*b* illustrates a schematic view of an arrangement for providing the switch circuit illustrated in FIGS. 1 and 2.

FIG. 3b illustrates a schematic view of a second arrangement 30' for providing the circuit 10, 10' illustrated in FIGS. 1 and 2. In the arrangement 30', the high-voltage transistor 14, the depletion mode transistor 17 and the diode 18 are each provided by discrete components, for example discrete semiconductor packages 32. The circuit 10, 10' may be formed by electrically conductive connections between the discrete packages 32 which may be provided by conductive traces on a substrate 33 on which the discrete packages 32 are mounted. This arrangement enables the circuit to assembled using standard package types. Each device may be provided in the same or differing standard package types.

A semiconductor package 32 typically includes a housing 34 such as a resin-based mould material which covers the semiconductor device and includes conductive outer contacts 35 which are coupled to the semiconductor device and further conductive traces and components outside of the package 32.

Figure 3C:
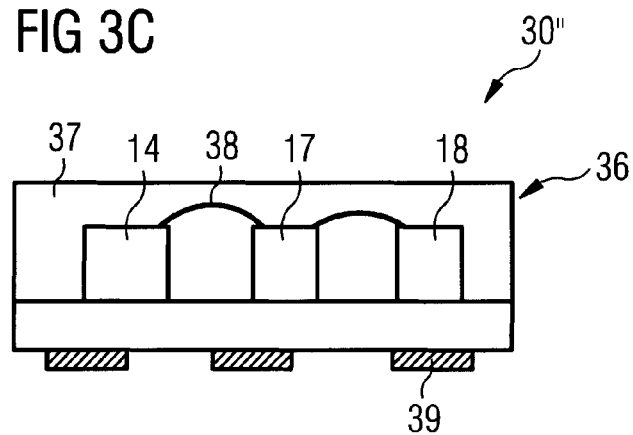
FIG. 3*c* illustrates a schematic view of an arrangement for providing the switch circuit illustrated in FIGS. 1 and 2.

FIG. 3c illustrates a schematic view enough of a third arrangement 30" for providing the circuit 10, 10' illustrated in FIGS. 1 and 2. In this arrangement, the high voltage transistor 14, the depletion mode transistor 17 and diode 18 are provided in a common package 36. The high voltage transistor 14, depletion mode transistor 17 and the diode 18 may be provided as discrete devices which are embedded in a common housing 37.

In some embodiments, the depletion mode transistor 17 and the high voltage transistor 14 are monolithically integrated in a common device and the diode 18 is provided as a separate discrete device. In embodiments in which the diode 18 is silicon-based and the high voltage transistor 14 and the depletion mode transistor 17 are Group III nitride-based, the package 36 may be termed a composite package or hybrid package. The package 36 may include a redistribution structure 38 and internal electrical connections, such as bond wires or contact clips which electrically couple the high voltage transistor 14, the depletion mode transistor 17 of the diode 18 to form the circuit illustrated in FIGS. 1 and 2. The package 36 may also include outer contacts 39 electrically coupled to the redistribution structure 38. In the third arrangement, a single package providing an equivalent circuit to that illustrated in FIGS. 1 and 2 may be provided.

Figure 4A:
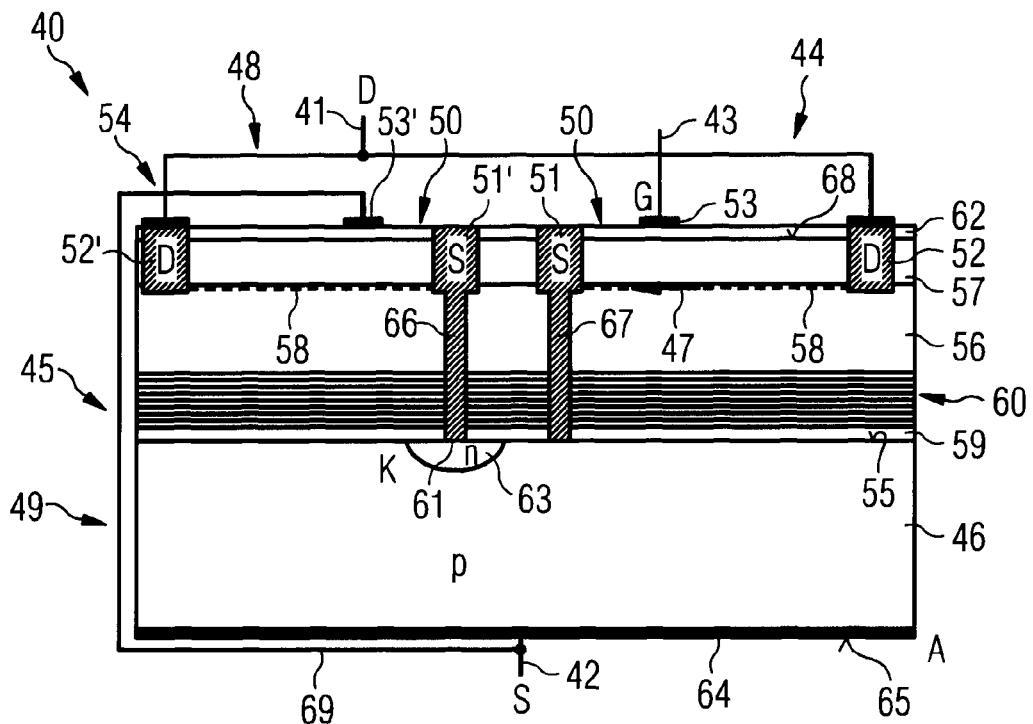
FIG. 4*a* illustrates a schematic cross-sectional view of a semiconductor device.

FIG. 4a illustrates a semiconductor device 40 which includes an equivalent circuit of the switching circuit 10 illustrated in FIG. 1. The semiconductor device 40 includes an input drain node 41, an input source node 42, an input gate node 43, a high-voltage Group III nitride-based transistor 44, a hybrid diode 45 and a silicon substrate 46. The high-voltage Group III nitride-based transistor 44 includes a current path 47 coupled in series with the hybrid diode 45. The hybrid diode 45 includes a depletion mode Group III nitride-based transistor 48 which is serially coupled with a diode 49, in particular, a low-voltage pn diode which is arranged at least in part in the silicon-based substrate 46. The depletion mode Group III nitride-based transistor 48 is further operatively coupled in a cascode arrangement with the input source node 42.

The high-voltage Group III nitride-based transistor 44 includes a plurality of transistor cells 50 which are coupled in parallel with one another. The depletion mode Group III nitride-based transistor 48 includes one of the transistor cells 50 of the high-voltage Group III nitride-based transistor 44 or a predetermined number of the transistor cells 50 of the high-voltage Group III nitride-based transistor 44 coupled in parallel. Each transistor cell 50 of the high-voltage Group III nitride-based transistor includes a source 51, a drain 52 and a gate 53 arranged laterally between the source 51 and the drain 52. The Group III nitride-based transistor is a lateral device. The transistor cell 54 of the high-voltage Group III nitride-based transistor 44 which forms the depletion mode Group III nitride-based transistor 48 of the hybrid diode 45 includes a gate 53' which is coupled with the input source node 42 to form the cascode arrangement.

The semiconductor device 40 includes a silicon-based substrate 46 which, in this embodiment, is p doped silicon. Group III nitride-based layers are arranged on first major surface 55 of the substrate 46 which are used to form the high-voltage Group III nitride-based transistor 44. In the embodiment illustrated in FIG. 4a, the high-voltage Group III nitride-based transistor 44 is a gallium nitride-based High Electron Mobility Transistor (HEMT) which includes a channel layer 56 including gallium nitride which is arranged on a major surface 55 of the substrate 46 and a barrier layer 57 which includes aluminium gallium nitride arranged on the channel layer 56.

A two-dimensional electron gas, which is indicated schematically in FIG. 4a with a dashed line 58, is formed at the interface between the channel layer 56 and the barrier layer 57 due to piezoelectric and spontaneous polarization. The high-voltage Group III nitride-based transistor 44 may further include a nucleation layer 59, for example aluminium nitride, and one or more further transition layers 60 arranged between the channel layer 56 and the barrier layer 57. The transition layer 60 may include alternating layers of aluminium gallium nitride and gallium nitride. A passivation layer 62 or one or more further insulation layers may be arranged on the gallium nitride barrier layer 57. The current of the current path 47 may flow along the interface in the 2DEG channel.

Each of the transistor cells 50 of the high-voltage Group III nitride-based transistor 44 includes a source 51 and a drain 52 which are electrically coupled to the two-dimensional electron gas 58. The high voltage Group III nitride-base transistor 44 may be a source-down device in which the source 51 includes a conductive via which extends through the barrier layer 57 into the channel layer 56 and is coupled to the two-dimensional electron gas 58. The gate 53 is arranged on the barrier layer 57 between the source 51 and the drain 52. The gate 53 may have different forms. For example, the gate 53 may include an insulation layer, a p-doped GaN layer to provide an enhancement mode device or may include a recessed gate structure. The gate may be a Schottky gate.

The semiconductor device 40 includes a diode 49 which is arranged at least in part in the silicon-based substrate 46. The diode 49 may include an n-doped region or well 63 which is arranged at the interface between the substrate 46 and the high-voltage Group III nitride-based transistor 44. As the substrate 46 is p-doped, a pn junction is formed at the interface between the n-doped well 63 and the substrate 46. The anode contact 64 of the diode 49 may be provided by a conductive layer on the lower surface 65 of the substrate 46.

The n-type well 63 in the p-type doped substrate 46 may be formed and activated before the stacked structure of the GaN HEMT is epitaxially grown on the substrate or after the vias for the vertical plugs through the stacked structure are provided.

The diode 49 may be a Schottky diode. However, if the diode 49 is a Schottky diode, a Schottky contact may be formed after the via is formed by introducing a suitable metal into the via which forms a Schottky contact with the silicon forming the base of the via. Schottky diodes may have desirable characteristics such as improved switching speeds and lower forward voltage drop compared to pn-diodes, for example. The blocking voltage of the diode should be high enough to withstand the pinch-off voltage of the HEMT device.

The hybrid diode 45 includes the diode 49 arranged on the silicon substrate 46 and the depletion mode Group III nitride-based transistor 48. The depletion mode Group III nitride-based transistor 48 is operatively coupled in a cascode arrangement with the input source node 42 and in series with the diode 49 as is indicated schematically with line 69. The cathode 61 of the diode 49 may be electrically coupled to the source 51' of the depletion mode Group III nitride-based transistor 48 by a conductive via 66 which extends between the source 51' and the n-doped region 63 and couples the depletion mode Group III nitride-based transistor 48 with the diode 49.

In the arrangement of the high-voltage Group III nitride-based transistor 44 illustrated in FIG. 4a, the conductive via 66 extends through the channel layer 56, the transition layers 60 and the buffer layer 59. The drain 52' of the depletion mode Group III nitride-based transistor 48 is electrically coupled with the drain 52 of the high-voltage Group III nitride-based transistor 44 and the drain node 41 such that the hybrid diode 45 is electrically coupled in parallel with the high-voltage Group III nitride-based transistor 44.

The semiconductor device 40 is a quasi-vertical device in which the source node 42 is arranged on the lower surface 65 of the substrate 46. The source 51 arranged on the opposing surface of the semiconductor device 40 is electrically coupled to the source node 42 arranged on the lower surface 65 of the semiconductor device 40 by a conductive via 67 which extends from the source 51 to the substrate 46 and is electrically coupled to a p-doped region of the substrate 46 adjacent the n-doped well 63 of the diode 49. The conductive via 67 extends through the channel layer 56, the transition layers 60 and the buffer layer 59.

The gate 53' of the depletion mode Group III nitride-based transistor 48 is coupled to the anode 64 of the diode 49 and the source 51 of the high-voltage Group III nitride-based transistor 44 on the rear surface 65 of the substrate 46. The connection between the gate 53' of the depletion mode Group III nitride-based transistor 48 and the source node 42 and anode 64 is illustrated in FIG. 4a schematically by the line 69.

Figure 4B:
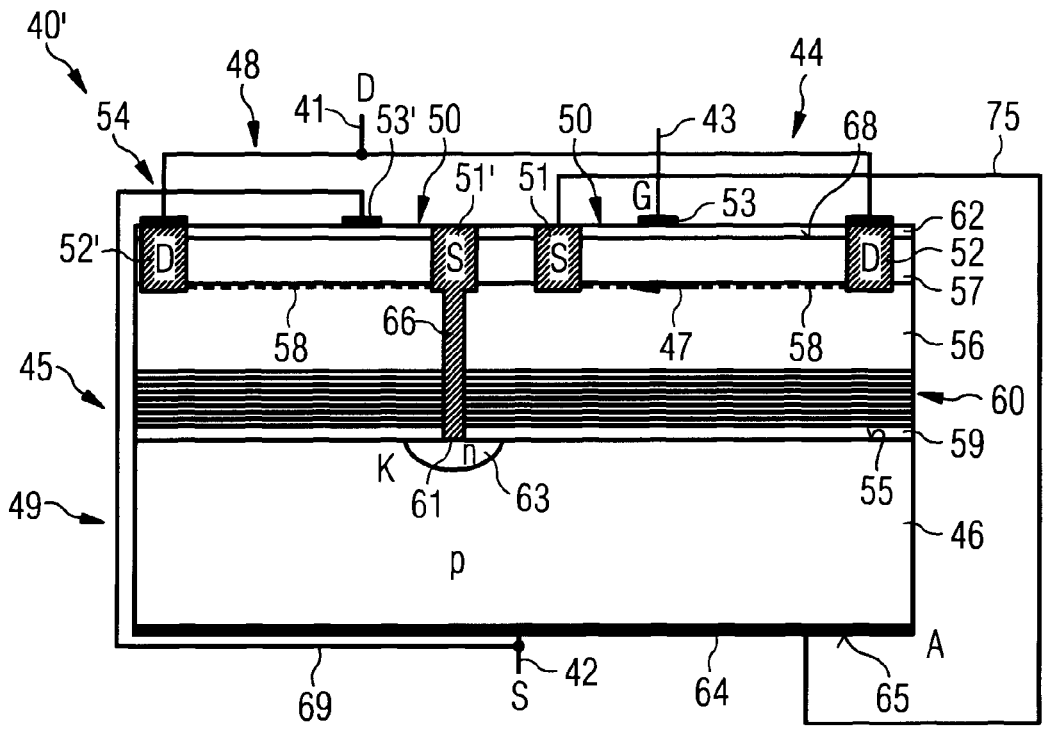
FIG. 4*b* illustrates a schematic cross-sectional view of a semiconductor device.

FIG. 4b illustrates a semiconductor device 40' which includes the high-voltage Group III nitride-based transistor 44 having a current path 47 coupled in series with the hybrid diode. The semiconductor device 40' includes a connection between the source 51 of the high-voltage transistor 44 and the anode 64, for example in the form of a bond wire, in place of the via 67 used in the semiconductor device 40 illustrated in FIG. 4a. The arrangement illustrated in FIG. 4b may be used to reduce or exclude the contribution of the p-type substrate to the overall device RDSON. Extra area may be required to form the source ohmic contact at the top surface.

Figure 5:
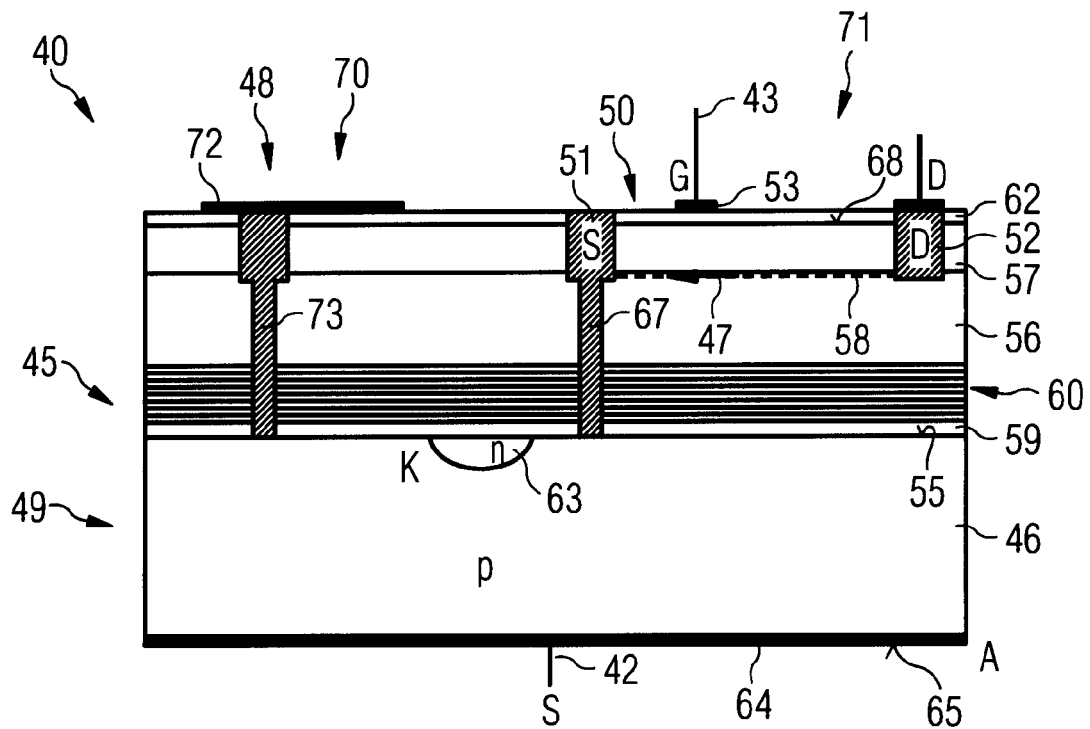
FIG. 5 illustrates a schematic cross-sectional view of the semiconductor device of FIG. 4*a*.

FIG. 5 illustrates a schematic cross-sectional view of the semiconductor device 40 in which a non-active region 70 can be seen. FIG. 5 illustrates that the gate 53' may be electrically coupled to the source node 42 and anode 64 by a conductive via 73 which extends between a gate pad 72 and the p-doped silicon substrate 46 in the non-active region 70 of the semiconductor device 40.

As used herein a "non-active region" is a region of a transistor device that cannot support an electrically conductive layer. For a lateral transistor device, a "non-active region" is a region of a lateral transistor device that cannot support a lateral, electrically conductive layer.

As used herein, an "active region" is a region of a transistor device that can support an electrically conductive layer. For a lateral transistor device, an "active region" is a region of a lateral transistor device that can support a lateral, electrically conductive layer.

A non-active region may be electrically insulating and may comprise a different material from the semiconductor material of the active region. For a HEMT (High Electron Mobility Transistor) such as a gallium nitride based HEMT, the active region is a region of the lateral transistor device in which a two-dimensional electron gas (2DEG) is supported when the gate is switched on. The non-active region is a region in which no 2DEG is supported when the gate is switched on. The non-active regions may be formed by ion implantation for isolation or by removing the barrier layer by, for example, mesa etching.

However, the active and non-active part refers to the diode, so it must be a normally-on active part here. If no additional measures are taken, a 2DEG is also formed here. Even if there is no designated source contact present here, as illustrated in FIG. 5, there may be a current flow to the next available source contact. However, this should not be harmful as this is a part of the diode and controlled via the gate of the diode part.

The gate pad 72 is coupled to the gate 53' of the depletion mode Group III nitride-based transistor 48 and is arranged on the passivation layer 62 on the upper surface 68 of the non-active region 70 of the semiconductor device 40. The non-active region 70 may be positioned peripheral to one or more active regions 71 of the high voltage transistor device Group III nitride-based transistor device 44. The n-doped well 63 is coupled to the source 51' by a conductive via 66, as illustrated in FIGS. 4a and 4b, in region of the semiconductor device which cannot be seen in the cross-sectional view of FIG. 5.

The conductive via 73 extends between the gate pad 72 arranged on the passivation layer 62, through the barrier layer 57, the channel layer 56, the transition layers 60 and the buffer layer 59 and electrically couples the gate pad 72 and gate 53' of the depletion mode Group III nitride-based transistor 48 to the p-doped substrate 46 and to the source node 42 and anode 64 on the rear surface 65. The conductive via 73 may be electrically insulated from the Group III nitride-based layers by lining the via with an electrically insulating material, such as silicon oxide.

Figure 6:
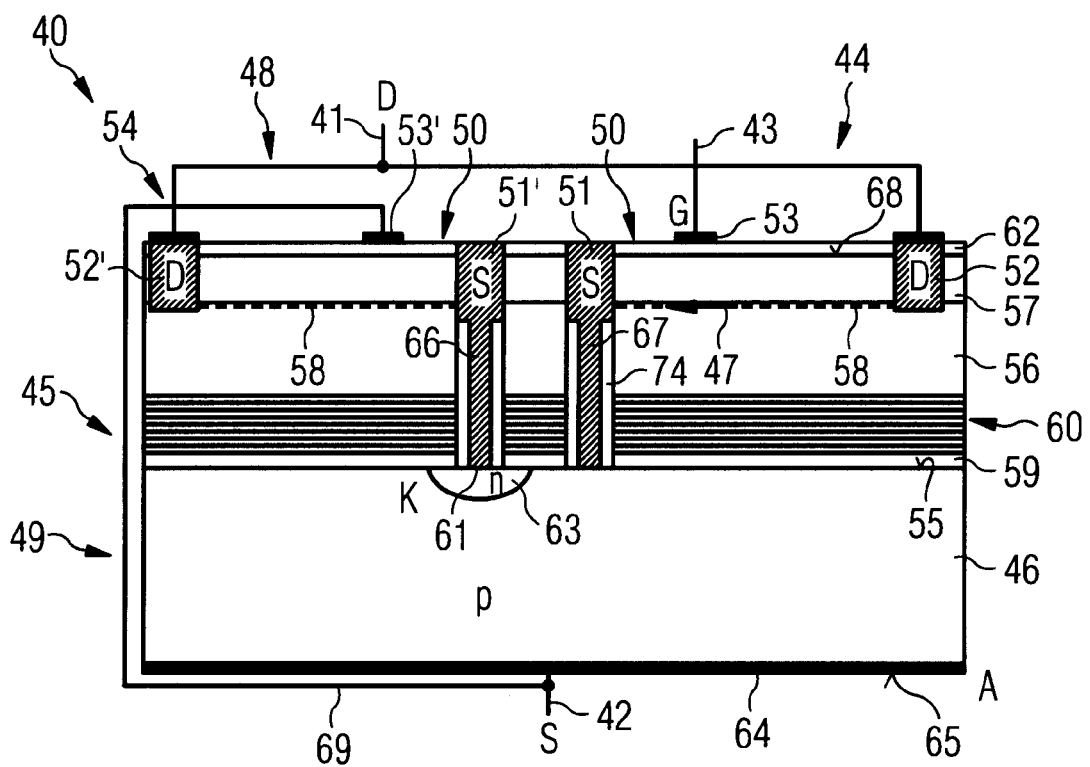
FIG. 6 illustrates a schematic cross-sectional view of a semiconductor device.

FIG. 6 illustrates a semiconductor device 40' providing the circuit for switching illustrated in FIG. 1. The semiconductor device 40' includes a silicon substrate 46 and a high-voltage Group III nitride-based transistor 44 arranged on the substrate 46. The semiconductor device 40' includes a hybrid diode 45 including a depletion mode Group III nitride-based transistor 48 formed from one or more cells of the high-voltage Group III nitride-based transistor 44. The depletion mode Group III nitride-based transistor 48 is coupled in series with a pn diode 49 arranged in the substrate 46 and operatively coupled in a cascode arrangement with the source node 42.

The semiconductor device 40' differs from the semiconductor device 40 in the form of the conductive via 66 which electrically couples the source 51' of the depletion mode Group III nitride-based transistor 48 to the cathode formed at the n-doped well 63 and the conductive via 67 which electrically couples the source 51 of the high-voltage Group III nitride-based transistor 44 and the p-doped substrate 46. Each of the conductive vias 66, 67 is lined with an electrically insulating material 74 in regions of the via which extend between the two-dimensional electron gas 58 and the p-doped substrate 46. The electrically insulating material 74 may include a dielectric such as silicon oxide. The conductive material may be in contact with the interface between the barrier layer 57 and the channel layer 56 so as to be coupled to the two dimensional electron gas.

Figure 7:
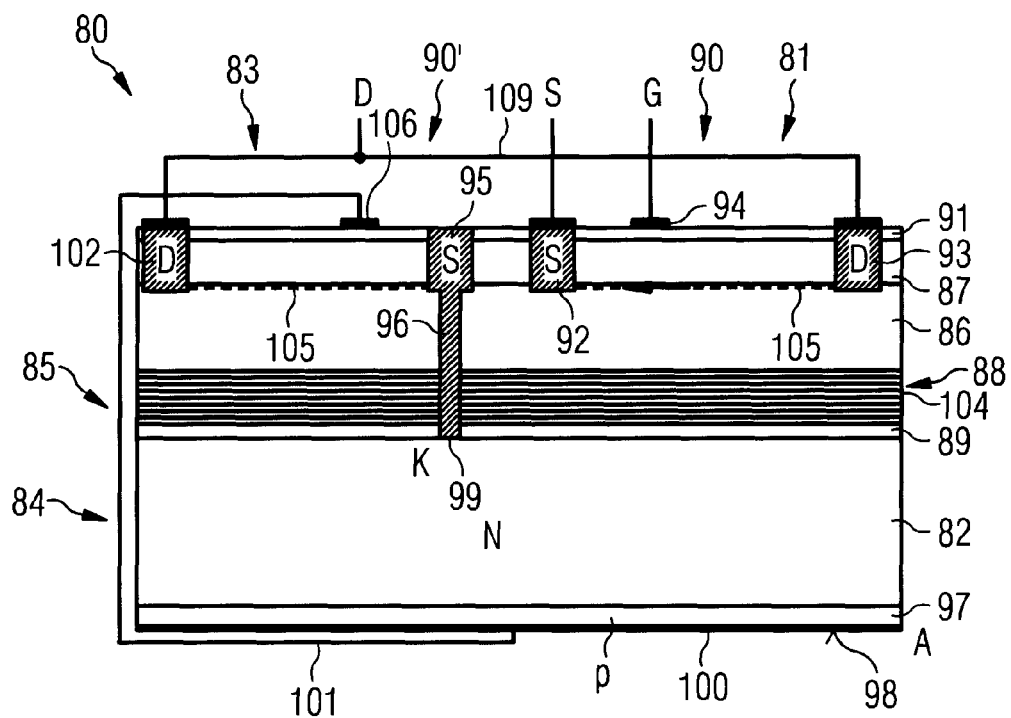
FIG. 7 illustrates a schematic cross-sectional view of a semiconductor device.

FIG. 7 illustrates a semiconductor device 80 which includes the circuit illustrated in FIG. 1. The semiconductor device 80 includes a high-voltage transistor in the form of a high-voltage gallium nitride-based HEMT 81 arranged on a silicon substrate 82. A portion of the high voltage gallium nitride-based HEMT 81 forms a depletion mode transistor 83 which is serially coupled with a diode 84 arranged in the substrate 82. The depletion mode transistor 83 and the diode 84 together form a hybrid diode 85 which is coupled in parallel with the gallium nitride-based HEMT 81. The substrate 82 includes n-doped silicon. The hybrid diode 85 includes two structures each of which is formed from a different semiconductor material.

The gallium nitride-based HEMT 81 includes a gallium nitride layer 86 forming a channel layer arranged on a first major surface 104 of the substrate 82 and an aluminium gallium nitride layer 87 forming a barrier layer arranged on the gallium nitride layer 86. A two-dimensional electron gas 105 is formed at the interface between the gallium nitride layer 86 and the aluminium gallium nitride layer 87 by induced and spontaneous polarization. Further layers 88 may be arranged between the gallium nitride layer 86 and the first major surface 104 of the substrate 82. For example, an aluminium nitride layer 89 may be arranged on the first major surface 104 of the substrate 82 and a plurality of transition layers, such as alternating layers of gallium nitride and aluminium gallium nitride may be arranged between the aluminium nitride layer 89 and the gallium nitride layer 86. A passivation layer 91 may be arranged on the aluminium gallium nitride layer 87. However, the HEMT structure is not limited to this exact arrangement and may include further layers such as a cap layer or other insulating layers arranged on the aluminium gallium nitride layer 87.

The high-voltage gallium nitride-based HEMT 81 includes a plurality of transistor cells 90 each including a source 92, a drain 93 and a gate 94 arranged between the source 92 and the drain 93 to form a lateral transistor device cell. The source 92 and the drain 93 may each include a conductive via which extends through the aluminium gallium nitride layer 87 and is coupled to the two-dimensional electron gas 105.

At least one transistor cell 90' or a plurality of transistor cells coupled in parallel is/are used to form the depletion mode transistor 83 of the hybrid diode 85. In order to couple the depletion mode transistor 83 in series with the diode 84, the source 95 of the depletion mode transistor 83 includes a conductive via 96 which extends through the aluminium gallium nitride layer 87, the gallium nitride layer 86 and further transition layers 88 and buffer layer 89, if present, to the n-doped silicon substrate 82. The diode 84 is formed in the silicon substrate 82 by providing a p-doped layer 97 on the rear surface 98 of the substrate 82 such that a pn junction and a diode 84 are formed in the silicon substrate 82.

The cathode 99 of the diode 84 is formed at the interface between the conductive via 96 and the n-doped substrate 82 and the anode 100 of the diode 84 are formed on the rear surface 98 of the p-doped layer 97. The gate 106 of the depletion mode transistor 83 is coupled to the anode 100 formed on the rear surface 98 as is indicated schematically by the line 101. The drain 102 of the depletion mode transistor 83 is electrically coupled to the drain 93 of the high-voltage gallium nitride-based HEMT 81 as is schematically indicated with line 103. The source 92 of the high-voltage gallium nitride-based transistor 81 may be electrically coupled to the anode 100 of the silicon diode 84 such that the hybrid diode 85 is electrically coupled in parallel with the high-voltage gallium nitride-based transistor 81 and forms a body diode.

The conductive via 96 may also include insulated cladding in regions between the interface between the aluminium gallium nitride layer 87 and the gallium nitride layer 86 and the first major surface 104 of the substrate 82.

The n-type silicon substrate may be replaced by an n-type silicon carbide substrate and the p-doped silicon layer by a p-doped silicon carbide layer.

The semiconductor device 80 includes a lateral high-voltage gallium nitride-based transistor 81 in which the source, drain and gate electrodes are arranged on a single major surface of the semiconductor device. In other embodiments, the high-voltage gallium nitride-based HEMT may include a quasi-vertical structure.

Figure 8:
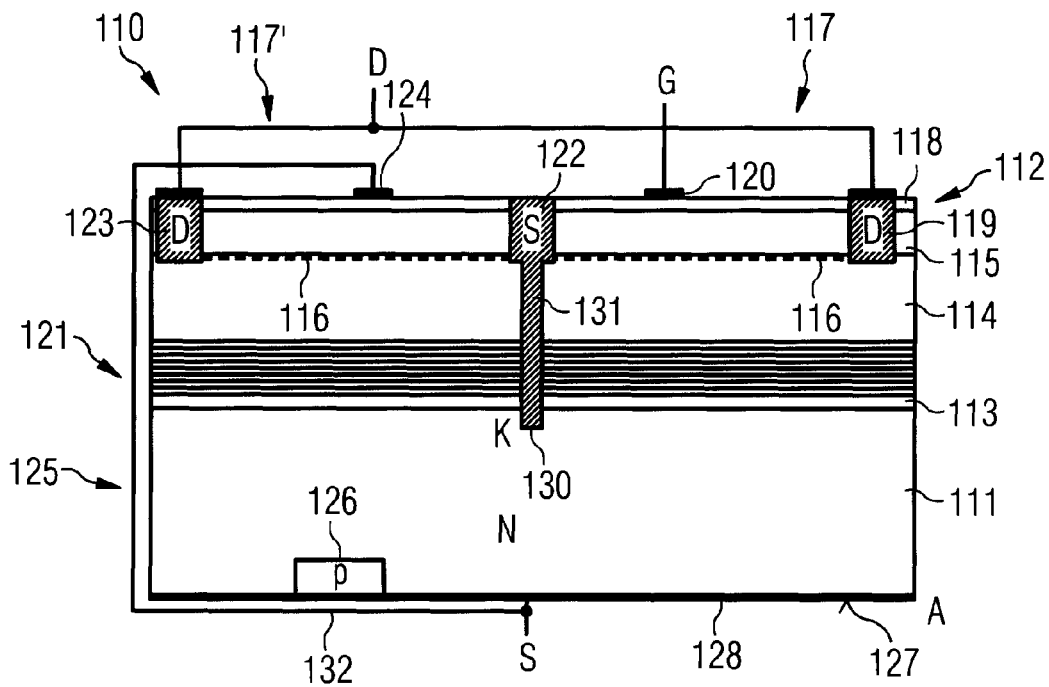
FIG. 8 illustrates a schematic cross-sectional view of a semiconductor device.

FIG. 8 illustrates a semiconductor device 110 which provides the circuit illustrated in FIG. 1. The semiconductor device are 110 includes a substrate 111 which includes n-doped silicon and a high-voltage gallium nitride-based HEMT 112 arranged on a first major surface 113 of the substrate 111. The gallium nitride-based HEMT 112 includes a gallium nitride-based layer 114 arranged on the upper surface 113 of the substrate 111 and an aluminium gallium nitride layer 115 arranged on the gallium nitride layer 114. A two-dimensional electron gas 116 is formed at the interface between the gallium nitride layer 114 and the aluminium gallium nitride layer 115 by induced and spontaneous polarization. The gallium nitride-based HEMT 112 may include further components such as one or more buffer layers and/or transition layers arranged between the gallium nitride layer 114 and first major surface 113 of the substrate 111 and one or more passivation layers or insulation layers arranged on the aluminium gallium nitride layer 115.

The high-voltage gallium nitride-based HEMT 112 includes a plurality of transistor cells 117. Each transistor cell 117 includes a source 118 and a drain 118 which are electrically coupled to the two-dimensional electron gas 116 and a gate 120 which is arranged between the source 118 and the drain 119 on the aluminium gallium nitride layer 115.

The gate 120 may include gate insulation between the gate metal and the aluminium gallium nitride layer 115. A p-doped gallium nitride layer may be arranged between the gate 120 and the aluminium gallium nitride layer 115 to create an enhancement mode high-voltage gallium nitride-based transistor which is normally off. The gate 120 may also have a recessed gate structure.

At least one transistor cell 117' of the high-voltage gallium nitride-based HEMT 112 is used to form a portion of a hybrid diode 121. The transistor cell 117' includes a source 122, a drain 123 and a gate 124 arranged between the source 122 and the drain 123. The transistor cell 117' provides a depletion mode transistor which is normally on. The hybrid diode 121 further includes a low-voltage silicon-based diode 125 formed in the substrate 111. In the embodiment illustrated in FIG. 8, the silicon-based diode 125 is a pn diode and includes a p-doped well 126 including p-doped silicon which is arranged in at the rear surface 127 of the n-doped-based substrate 111 underneath the depletion mode transistor 121.

A metallic layer 128 may be arranged on the rear surface 127 of the substrate 111 which is coupled to the p-doped well 126 and which forms an anode 129 of the silicon-based diode 125. The cathode 130 of the silicon-based diode 125 is coupled to the source 122 of the depletion mode transistor 117' by a conductive via 131 which extends from the source 122 through the aluminium gallium nitride layer 115 and the gallium nitride layer 114 to the n-doped substrate 111. The conductive via 131 electrically couples the source 122 of the depletion mode transistor 117' with the cathode 130 formed at the interface between the conductive material of the conductive via 129 and the n-doped substrate 111.

In the embodiment illustrated in FIG. 8, a common source is provided for the source 122 of the depletion mode transistor 117' of the hybrid diode structure 121 and the source 118 of the high-voltage gallium nitride-based HEMT 112. The gate 120 of the depletion mode transistor is electrically coupled to the anode 129 of the diode 128 and the source 118 of the high-voltage gallium nitride-based HEMT 112 as a schematically indicated by the line 132.

The drain 123 of the depletion mode transistor 117' is electrically coupled to the drain 119 of the high-voltage gallium nitride-based HEMT 112. The hybrid diode 121 includes the depletion mode transistor 117' which is serially coupled with the silicon-based diode 125 and operatively coupled in a cascode arrangement with the anode 129 of the silicon-based diode 125. The hybrid diode 121 is electrically coupled in parallel with the high-voltage gallium nitride-based HEMT 112.

In some embodiments, the semiconductor device includes a low forward voltage drop, from a low leakage current, in particular in case of using a pn-diode, is applicable to a wide range of voltage classes without touching the diode structure in the silicon and consequently is applicable to any breakdown voltage class. Apart of the active HEMT area is used for the diode functionality, but compared to a solution with a paralleled GaN Schottky diode the active area loss can be lower due to the lower VF of the proposed solution.

A reverse diode capability with low forward voltage drop and low leakage current is provided for a depletion mode or enhancement mode GaN Power HEMT on a silicon substrate which may include a GaN-based transistor structure on a Silicon or silicon carbide substrate, a Normally-on HEMT structure in GaN, a pn-diode in the Silicon, one or more vertical plugs through the GaN to connect the elements and a cascode-like arrangement of a part of the HEMT with the silicon diode in order to realize the blocking capability of the power switch. The hybrid diode may be used to provide an inherent diode function having a low forward voltage drop in a high-voltage transistor, such as a Group III-nitride based HEMT.

The semiconductor devices may include a structure leading to an equivalent circuit similar to that illustrated in FIG. 1. A circuit is provided using a part of the HEMT for a diode and connecting it with a low-voltage diode in the silicon to form a hybrid diode. This hybrid diode provides a diode function with a forward voltage drop being equal to the knee voltage of the diode plus the forward voltage drop through the HEMT channel depending on the current through the device. Since the blocking voltage of the diode must only be enough to withstand the pinch-off voltage of the HEMT device, it is possible to use a Schottky diode in place of a pn diode.

In principle, the reverse current (leakage) level of such a circuit is rather constant until breakdown of the device is reached. The level of this leakage current is determined by the leakage current of the diode at the pinch-off voltage.

In some embodiments, the semiconductor device includes a low forward voltage drop, from a low leakage current, in particular in case of using a pn-diode, is applicable to a wide range of voltage classes without touching the diode structure in the silicon and consequently is applicable to any breakdown voltage class.

A reverse diode capability with low forward voltage drop and low leakage current is provided for a depletion mode or enhancement mode GaN Power HEMT on a silicon substrate which may include a GaN-based transistor structure on a Silicon or silicon carbide substrate, a Normally-on HEMT structure in GaN, a pn-diode in the Silicon, one or more vertical plugs through the GaN to connect the elements and a cascode-like arrangement of a part of the HEMT with the silicon diode in order to realize the blocking capability of the power switch.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and de-scribed herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A switch circuit, comprising:
   an input drain node, an input source node and an input gate node; and
   a high voltage transistor comprising a current path coupled in parallel with a hybrid diode, the hybrid diode comprising a depletion mode transistor serially coupled with a diode and operatively coupled in a cascode arrangement with the input source node.

2. The switch circuit according to claim 1, wherein a gate of the depletion mode transistor is coupled with a source of the high voltage transistor and an anode of the diode.

3. The switch circuit according to claim 1, wherein the high voltage transistor is a depletion mode transistor or an enhancement mode transistor.

4. The switch circuit according to claim 1, wherein the depletion mode transistor is at least partially integrated in the high voltage transistor.

5. The switch circuit according to claim 1, wherein the high voltage transistor comprises a plurality of transistor cells coupled in parallel with each other and integrated in a semiconductor substrate and the depletion mode transistor comprises one of said transistor cells or a predetermined number of said transistor cells coupled in parallel.

6. The switch circuit according to claim 1, wherein the high voltage transistor, the depletion mode transistor and the diode are monolithically integrated.

7. The switch circuit according to claim 1, wherein the high voltage transistor is provided as a discrete component and the depletion mode transistor is provided as a discrete component and the diode is provided as a discrete component.

8. The switch circuit according to claim 1, wherein the high voltage transistor, the depletion mode transistor and the diode are arranged in a composite package.

9. The switch circuit according to claim 1, wherein the high voltage transistor comprises a Group III Nitride-based transistor.

10. The switch circuit according to claim 1, wherein the high voltage transistor comprises a Group III Nitride-based high electron mobility transistor.

11. The switch circuit according to claim 1, wherein the diode is a silicon-based pn diode or a silicon-based Schottky diode.

12. The switch circuit according to claim 1, wherein a source of the depletion mode transistor is coupled to a cathode of the diode.

13. The switch circuit according to claim 1, wherein a drain of the depletion mode transistor is coupled with a drain of the high voltage transistor.

14. A semiconductor device, comprising:
an input drain node, an input source node and an input gate node;
a high voltage Group III nitride-based transistor comprising a current path coupled in parallel with a hybrid diode; and
a silicon-based substrate,
wherein the Group III nitride-based high voltage transistor comprises a plurality of transistor cells coupled in parallel with each other,
wherein the hybrid diode comprises a depletion mode Group III nitride-based transistor serially coupled with a diode and operatively coupled in a cascode arrangement with the input source node,
wherein the depletion mode transistor comprises one of said transistor cells or a predetermined number of said transistor cells coupled in parallel and the diode is arranged at least in part in the silicon-based substrate.

15. The semiconductor device according to claim 14, wherein the high voltage Group III nitride-based transistor is arranged on the silicon-based substrate.

16. The semiconductor device according to claim 14, wherein the silicon-based substrate includes silicon or silicon carbide.

17. The semiconductor device according to claim 14, wherein a source of the depletion mode Group III nitride-based transistor is coupled with a cathode of the diode by a conductive via.

18. The semiconductor device according to claim 17, wherein the conductive via further includes electrically insulative cladding.

19. The semiconductor device according to claim 14, wherein the gate of the depletion mode Group III nitride-based transistor is coupled with a source of the high voltage Group III nitride-based transistor and an anode of the diode, the anode being arranged on a rear surface of the substrate.

20. The semiconductor device according to claim 14, wherein a gate of the depletion mode Group III nitride-based transistor is coupled with a source of the high voltage Group III nitride-based transistor and an anode of the diode, one of the group consisting of the anode and the cathode being arranged at an interface between the silicon-based substrate and the high voltage Group III nitride-based transistor.

* * * * *